United States Patent [19]

Koike

[11] Patent Number: 5,557,235

[45] Date of Patent: Sep. 17, 1996

[54] SEMICONDUCTOR DEVICE COMPRISING A GROUNDING PAD NEAR A REFERENCE SIGNAL PAD AND A CAPACITOR BETWEEN THE PADS

[75] Inventor: Hiroki Koike, Tokyo, Japan

[73] Assignee: NEC Corporation, Tokyo, Japan

[21] Appl. No.: 339,729

[22] Filed: Nov. 14, 1994

[30] Foreign Application Priority Data

Nov. 24, 1993 [JP] Japan .................................. 5-317390

[51] Int. Cl.$^6$ ..................................................... H01L 25/00
[52] U.S. Cl. ........................... 327/564; 327/565; 326/101
[58] Field of Search ................................... 327/564, 565, 327/566; 326/101, 102, 103, 47

[56] References Cited

U.S. PATENT DOCUMENTS

| | | | |
|---|---|---|---|
| 4,278,897 | 7/1981 | Ohno et al. | 326/101 |
| 4,786,828 | 11/1988 | Hoffman | 327/566 |
| 4,827,368 | 5/1989 | Suzuki et al. | 326/101 |
| 4,926,066 | 5/1990 | Maini et al. | 327/565 |
| 5,043,597 | 8/1991 | Furuyama et al. | 326/101 |

FOREIGN PATENT DOCUMENTS

| | | |
|---|---|---|
| 316082 | 5/1989 | European Pat. Off. . |
| 1-239964 | 9/1989 | Japan . |
| 3-120743 | 5/1991 | Japan . |

OTHER PUBLICATIONS

Patent Abstracts of Japan, JPA–63 052464, Mar. 5, 1988, vol. 012, No. 268 (E–638).
Patent Abstracts of Japan, JPA 01 065864, Jun. 26, 1989, vol. 013, No. 277 (E–778).
Patent Abstracts of Japan, JPA 59 169166, Sep. 25, 1984, vol. 009, No. 023 (E–293).

Primary Examiner—David C. Nelms
Assistant Examiner—Trong Phan
Attorney, Agent, or Firm—Sughrue, Mion, Zinn, Macpeak & Seas

[57] ABSTRACT

In a semiconductor device comprising on a semiconductor substrate (41) first and second input buffers (21), first and second input signal connections (25) supplying the input buffers from input signal pads (23) with input signals, respectively, each with a buffer input level, and first and second reference signal connections (29) supplying a reference signal from a reference signal pad (27) to the input buffers with buffer reference levels, respectively, a grounding pad (71) is laid near the reference signal pad and supplied with a ground level for the semiconductor device with a capacitor (73) connected between the semiconductor substrate and each reference signal connection near the reference signal pad and preferably with the reference signal connections laid geometrically parallel to the input signal connections. If lengthy, each reference signal connection comprises a first part laid parallel to a pertinent one of the input signal connections between a relevant one of the input buffers and a node (69) and a second part extended from the node to the reference signal pad. Each input buffer can produce an output signal of a CMOS level when each input signal connection is supplied with a relevant one of the input signals with a TTL level. Preferably, each input buffer comprises a current mirror circuit for cancelling a variation in the buffer input signal and a variation in a relevant one of the buffer reference level with each other. The capacitor has a capacitance given by a gate capacitance of an MOS transistor.

8 Claims, 8 Drawing Sheets

FIG. 15(B)
EMBODIMENT

SEMICONDUCTOR DEVICE COMPRISING A GROUNDING PAD NEAR A REFERENCE SIGNAL PAD AND A CAPACITOR BETWEEN THE PADS

BACKGROUND OF THE INVENTION

This invention relates to a semiconductor device which comprises an input buffer supplied with an input signal of an input level, such as a transistor/transistor logic (TTL) level, and a reference signal of a reference level to produce an output signal of an output level, such as a complementary metal-oxide semiconductor (CMOS) logic level, for use in the semiconductor device.

A complementary metal-oxide semiconductor device is suitable for large scale integration (LSI) and is therefore widely used in integrated semiconductor circuits (IC). Such complementary metal-oxide semiconductor devices are supplied with input signals which usually have the transistor/transistor logic level. On the other hand, the complementary metal-oxide semiconductor logic level is used in the complementary metal-oxide semiconductor devices. As a consequence, an input/output (I/O) interface is used in converting the transistor/transistor logic level to the complementary metal-oxide semiconductor logic level. The input buffer is used as the input/output interface and is designed to convert the transistor/transistor logic level to the complementary metal-oxide semiconductor logic level by comparing the transistor/transistor logic level with the reference level.

In the manner which will later be described in greater detail, a conventional semiconductor device of this type comprises on its semiconductor substrate an input buffer, an input signal pad supplied with an input signal of a source input level, such as the transistor/transistor logic level, an input signal connection for delivering the input signal to the input buffer, a reference signal pad supplied with a reference signal of a source reference level, and a reference signal connection for delivering the reference signal to the input buffer. Supplied with the input and the reference signals in this manner with a buffer input level and a buffer reference level, the input buffer compares the buffer input and reference levels with each other and produces an output signal with an output level, such as the complementary metal-oxide semiconductor logic level.

Each of the input and the reference signal connections has a parasitic resistance and a parasitic capacitance. The buffer input and reference levels are consequently different from the source input and reference levels. This gives rise to an objectionable delay in operation of the input buffer, particularly when noise is superimposed on the input and/or the reference signal connection.

In order to cope with the delay, an improved semiconductor device is disclosed in Japanese Patent Prepublication (A) No. 239,964 of 1989. This improved semiconductor device is excellently operable. The improved semiconductor device is, however, defective in that it unavoidably requires a wide chip area.

Another improved semiconductor device is revealed in Japanese Patent Prepublication (A) No. 120,743 of 1991. This improved semiconductor device is exqusitly operable but is disadvantageous as regards its inevitably wide chap area and noise superposed on the input and the reference signals by capacitive coupling between the substrate and the input and the reference signal connections through their parasitic capacitances.

SUMMARY OF THE INVENTION

It is consequently a principal object of the present invention to provide a semiconductor device which comprises an input buffer for producing an output signal for use in the semiconductor device in response to an input signal and a reference signal and in which the input buffer produces the output signal with little delay.

It is another principal object of this invention to provide a semiconductor device which is of the type described and in which the little delay is insured even when noise is superposed on input and reference signal connections for delivering the input and the reference signals to the input buffer.

It is still another principal object of this invention to provide a semiconductor device which is of the type described and which need not a wide chip area.

It is a subordinate object of this invention to provide a semiconductor device which is of the type described and in which the little delay is warranted even when noise is superimposed on the input and the reference signals by capacitive coupling through parasitic capacitances of the input and the reference signal connections.

Other objects of this invention will become clear as the description proceeds.

In accordance with this invention, there is provided a semiconductor device which comprises on a semiconductor substrate: (A) an input buffer: (B) input signal delivering means for delivering an input signal to the input buffer with a buffer input level; (C) input signal supply means for supplying the input signal to the input signal delivering means with a source input level; (D) reference signal delivering means for delivering a reference signal to the input buffer with a buffer reference level; (E) reference signal supply means for supplying the reference signal to the reference signal delivering means with a source reference level; (G) ground supply means adjacent to the reference signal supply means for supplying the semiconductor substrate with a ground level of the semiconductor device; and (H) a capacitor between the reference signal delivering means adjacent reference signal supply means and the semiconductor substrate.

DESCRIPTION OF THE PREFERRED EMBODIMENTS

Referring to FIGS. 1 through 8, conventional semiconductor devices will first be described and analyzed in order to facilitate an understanding of the present invention.

Figure 1:
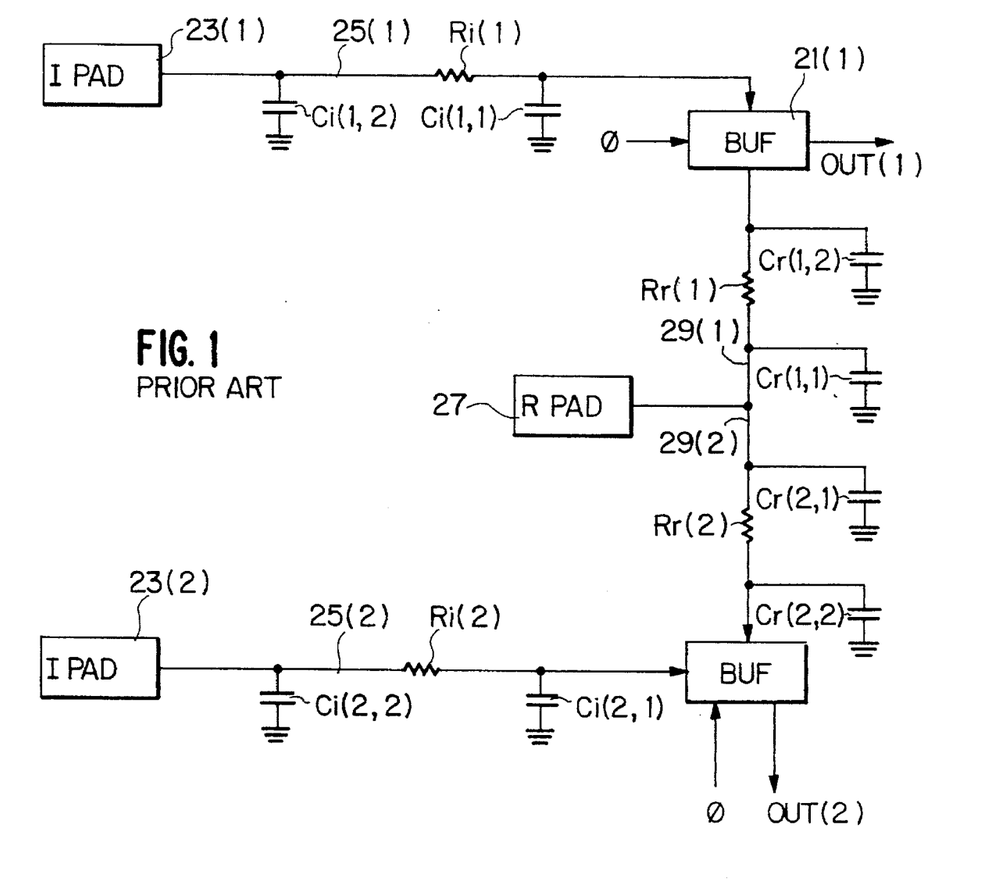
FIG. 1 is a layout diagram of a conventional semiconductor device.

Referring to FIG. 1, a conventional semiconductor device comprises an its semiconductor substrate first and second input buffers (BUF) 21(1) and 21(2) which will either collectively or singly be designated by a single reference numeral 21 by omitting the suffixes enclosed with parentheses. The first and the second input buffers 21 are for producing first and second buffer output signals OUT(1) and OUT(2) which will either collectively or individually be designated by a single reference symbol OUT and are for use in the semiconductor device. Such manners of designation will be used throughout the following description en referring to a plurality of similarly named components, signals, and so forth.

First and second input signal pads (I PAD) 23(1) and 23(2) or 23 are supplied with first and second input signals of first and second source input levels INs(1) and INs(2) or INs. First and second input signal connections 25(1) and 25(2) or 25 are for delivering the first and the second input signals to the first and the second input buffers 21, respectively. In the manner which will presently be described more in detail, the first input signal connection 25(1) has a first parasitic input resistance Ri(1) and first primary and secondary parasitic input capacitances Ci(1, 1) and Ci(1, 2) relative to the semiconductor substrate represented by grounds. Likewise, the second input signal connection 25(2) has a second parasitic input resistance Ri(2) and second primary and secondary parasitic input capacitances Ci(2, 1) and Ci(2, 2). Due to the first and the second parasitic input resistances Ri and the first and the second primary and secondary parasitic input capacitances Ci, the first and the second input signals are supplied to the first and the second input buffers 21 with first and second buffer input levels INb(1) and INb(2) or INb.

A reference signal pad (R PAD) 27 is supplied with a reference signal of a source reference level REFs. First and second reference signal connections 29(1) and 29(2) or 29 deliver the reference signal to the first and the second input buffers 21. Like the first and the second input signal connections 25, the first reference signal connection 29(1) has a first parasitic reference resistance Rr(1) and first primary and secondary parasitic reference capacitances Cr(1, 1) and Cr(1, 2). The second reference signal connection 29(2) has a second parasitic reference resistance Rr(2) and second primary and secondary parasitic reference capacitances Cr(2, 1) and Cr(2, 2). Due to the first and the second parasitic reference resistances Rr and the first and the second primary and secondary parasitic reference capacitances Cr, the reference signal arrives at the first and the second input buffers 21 with first and second buffer reference levels REFb(1) and REFb(2) or REPb.

In FIG. 1, the semiconductor device is typically a general-purpose dynamic random access memory (DRAM). In such an event, the input signals are a row address signal (RAS), a column address signal (CAS), a write enable signal (WE), an output enable signal (OE), memory address signals, input/output (I/O) data signals, and so on. A plurality of input buffers 21 are used in correspondence to such input signals. The source input level of each input signal is typically a transistor/transistor logic (TLL) level. The buffer output signal has typically a complementary metal-oxide semiconductor (CMOS) logic level. Under the circumstances, the source reference level is determined in the manner known in the art in consideration of the buffer input and reference levels.

Figure 2:
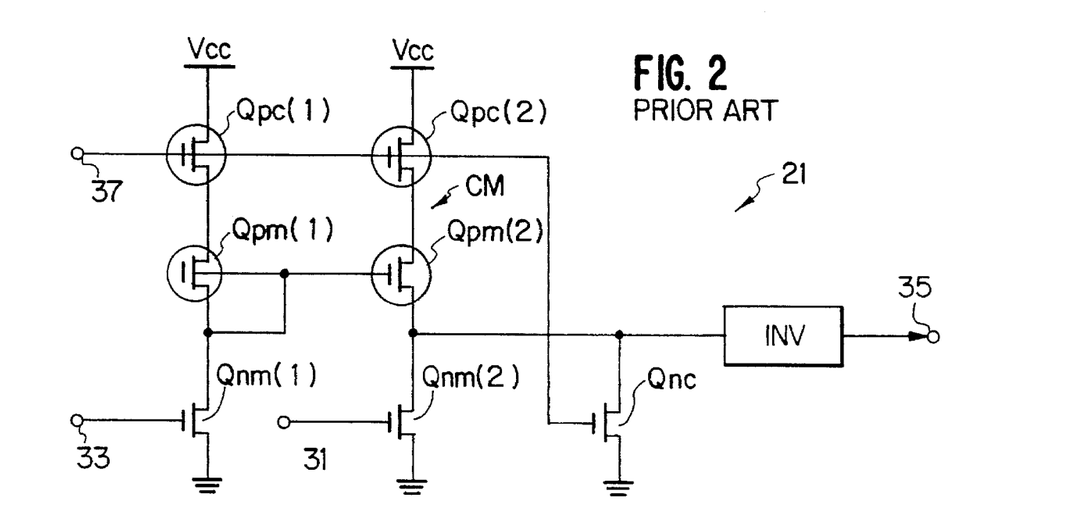
FIG. 2 shows partly in blocks an input signal pad which is generally used in a semiconductor device of the type depicted in FIG. 1.

Turning to FIG. 2, each of the input buffers 21 has a buffer input terminal 31 connected to the input signal connection 25, a buffer reference terminal 33 connected to the reference signal connection 29, a buffer output terminal 35 producing the buffer output signal OUT, and a clock input terminal 37 supplied with a clock signal ø variable between high and low levels in the manner known in the art and comprises a current mirror circuit CM, an inverter INV, and a control circuit. The current mirror circuit CM comprises first and second p-channel circuit metal-oxide semiconductor (MOS) transistors Qpm(1) and Qpm(2) or Qpm, a first n-channel circuit metal-oxide semiconductor transistor Qnm(1) connected to the buffer reference terminal 33, and a second n-channel circuit metal-oxide semiconductor transistor Qnm(2) connected to the buffer input terminal 31.

The inverter INV is supplied from a point of connection between the second p-channel and n-channel circuit metal-oxide semiconductor transistors Qpm(2) and Qnm(2). The control circuit comprises first and second p-channel control metal-oxide semiconductor transistors Qpc(1) and Qpc(2) or Qpc connected in common to a power source Vcc of a source voltage and to the first and the second p-channel circuit metal-oxide semiconductor transistors Qpm and an n-channel control metal-oxide semiconductor transistor Qnc grounded and connected to the point of connection between the current mirror circuit CM and the inverter INV. The p-channel and the n-channel control metal-oxide semiconductor transistors Qpc and Qnc are connected to the clock input terminal 37 to activate and deactivate the current mirror circuit CM and the inverter INV when the clock signal has the low and the high levels.

When activated, the current mirror circuit CM compares the buffer input level INb with the buffer reference level REFb. When concurrently activated, the inverter INV produces the buffer output signal with high and low output levels if the buffer input level is higher and lower than the buffer reference level. The source voltage is either 5.0 V plus or minus 0.5 V or 3.3 V plus or minus 0.5 V.

Figure 3:
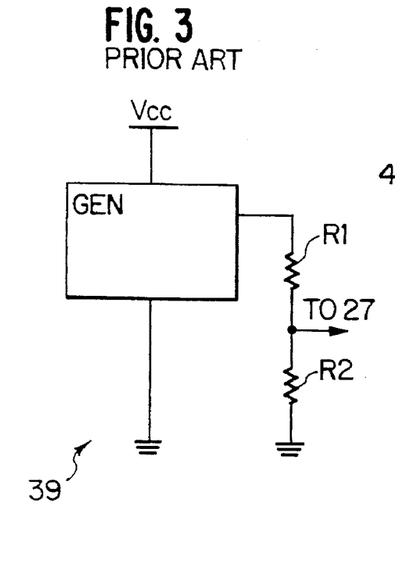
FIG. 3 shows partly in blocks a reference signal generator which is used in general in a semiconductor device mentioned in connection with FIG. 2.

Further turning to FIG. 3, a reference signal source 39 is connected to the reference signal pad 27. In the reference signal source 39, a reference signal generator GEN has a generator output terminal and is connected between the power source Vcc and ground to produce a constant signal of a constant voltage independent of the source voltage. A voltage divider comprises first and second resistors R1 and R2 connected in series between the generator output terminal and ground to divide the constant signal into the reference signal of the source reference level for delivery to the reference signal pad 27.

Figure 4:
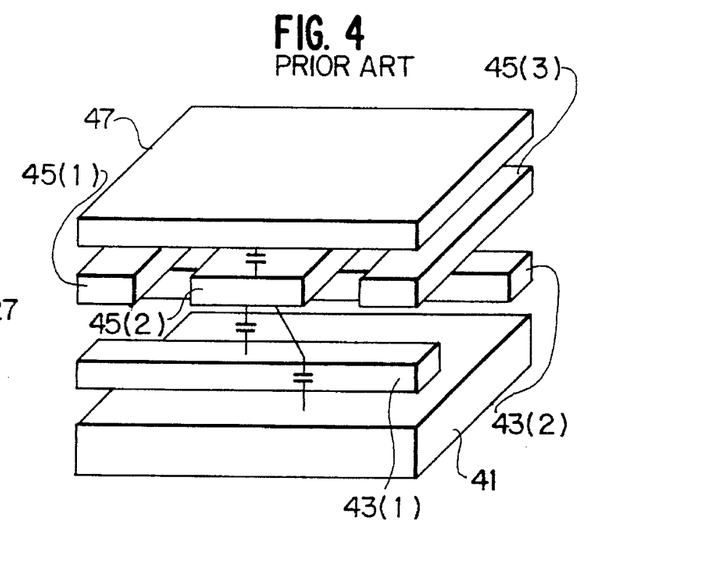
FIG. 4 is a perspective view of a general semiconductor device which may be the semiconductor device shown in FIG. 1.

Still further turning to FIG. 4, the semiconductor substrate is depicted at 41. In the known manner, a multi-layer wiring provides the connections 25 and 29. An insulator layer is exemplified as first and second polycrystalline silicon layers 43(1) and 43(2). A first conductive layer is exemplified by first through third primary aluminium layers 45(1), 45(2), and 45(3). A second conductive layer is exemplified by a second aluminium layer 47.

It is clear that each of the first through the third primary aluminium layers 45 and the second aluminium layer 47 has a parasitic resistance. As exemplified by small capacitors, parasitic capacitances are formed between the semiconductor substrate 41 and the first through the third primary aluminum layers 45 and the second aluminium layer 47 and also between the connections, such as between the first through the third primary aluminium layers 45 and the second aluminium layer 47.

Referring afresh to FIG. 5 and again to FIG. 1, time t is scaled along the abscissa with levels L of various signals and of ground shown along the ordinate. It will be assumed that the source input level INs varies from a high input level to a low input level. Due to the parasitic input resistance Ri and the parasitic capacitances Ci, the buffer input level INb varies in general with a delay relative to the source input level.

Figure 5:
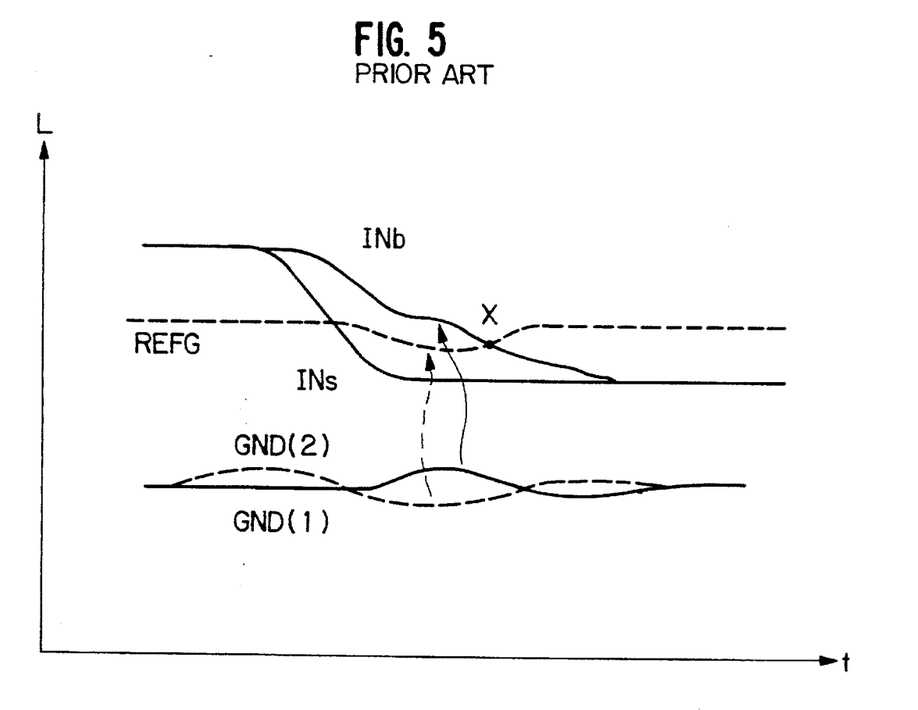
FIG. 5 schematically shows operation of the semiconductor device illustrated in FIG. 1.

In the meantime, the buffer reference level REFb is kept constant by nature. The buffer input and reference levels are, however, influenced by noise superposed thereon by a coupling capacitance of the parasitic input and reference capacitances. As a consequence, the buffer input and reference levels vary in practice as exemplified by a positive going swell in the buffer input level and by an upper dashed-line curve labelled REFb.

More particularly, various signal levels may vary on other connections ether than one of the input and the reference signal connections 25 and 29 that delivers the input or the reference signal to the input buffer 21. Furthermore, the noise varies from time to time and depending on parts of the semiconductor substrate 41. For example, the semiconductor substrate 41 has a substrate level or counter-electrode level Gnd which varies at the input and the reference signal connections 25 and 29 as exemplified by a lower solid-line curve labelled Gnd (1) and by a dashed-line curve Gnd(2). When the substrate level varies in positive and negative senses, the buffer input and reference levels vary in positive and negative senses. As a result, the buffer input level becomes equal to the buffer reference level at a time instant indicated by a cross x with an additional delay introduced by the noise.

Figure 6:
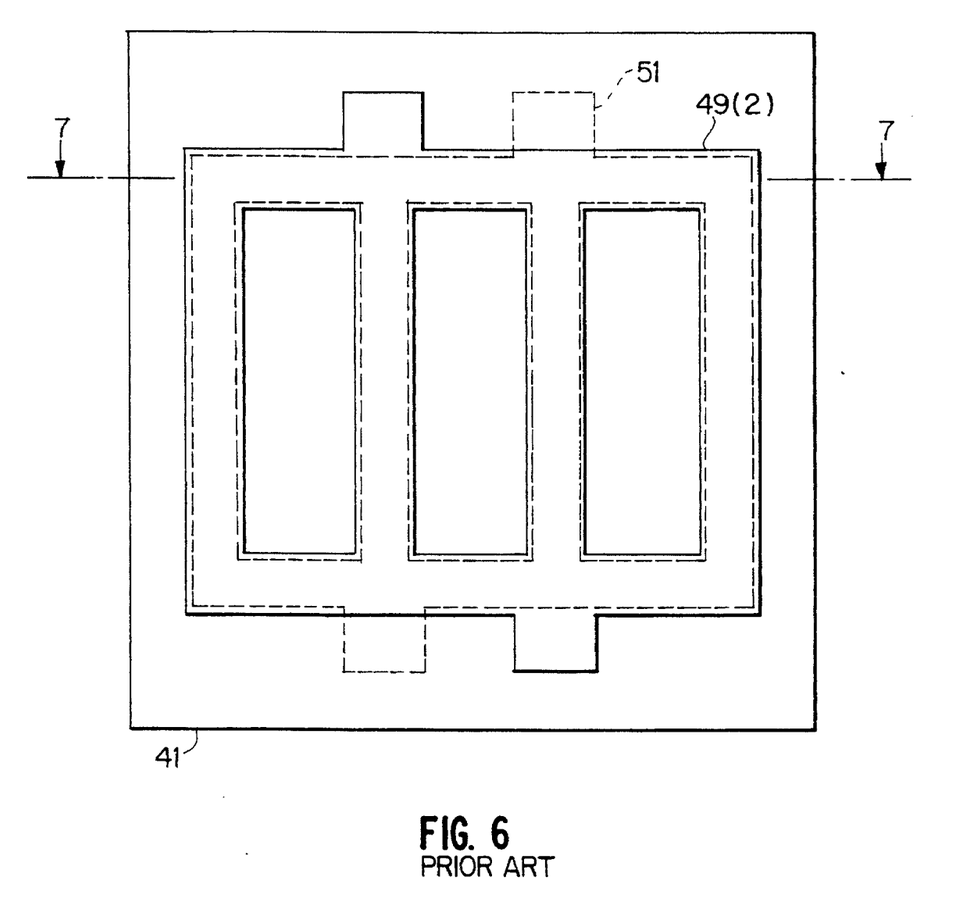
FIG. 6 is a schematic top view of an improved semiconductor device known in prior art.
Figure 7:
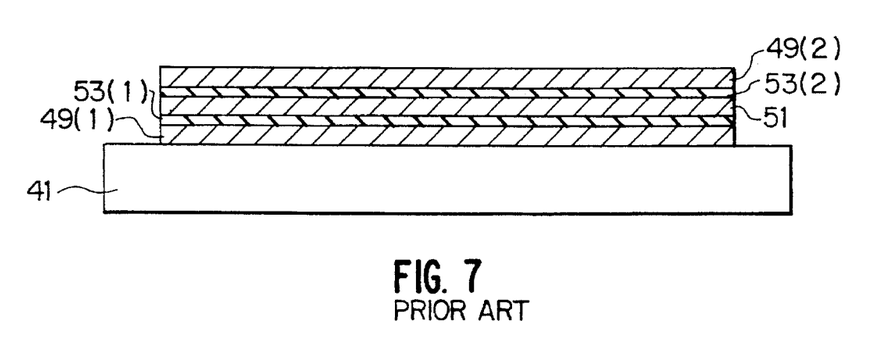
FIG. 7 is a schematic vertical sectional view taken along line 7—7 of FIG. 6.

Turning to FIGS. 6 and 7, an improved semiconductor device is what is disclosed in the Japanese patent prepublication (A) No. 239,964 of 1989 cited hereinabove. This semiconductor device is for suppressing the influence of the noise on the input and the reference signal connections 25 and 29 described in conjunction with FIGS. 1 and 5.

In FIGS. 6 and 7, a semiconductor substrate is depicted at 41 as before. Directly on the semiconductor substrate 41, a first conductive layer 49(1) is selectively formed. A grounding layer 51 is formed on the first conductive layer 49(1) with a first insulator layer 53(1) interposed. On the grounding layer 51, a second insulator layer 53(2) and a second conductive layer 49(2) are successively stacked. As best shown in FIG. 6, the second conductive layer 49(2) is selectively formed in vertical alignment with the grounding layer 51. This applies to the first conductive layer 49(1) and the grounding layer 51. In FIG. 6, the grounding layer 51 is dislocated merely for clarity of illustration from the second conductive layer 49(2).

It is now understood that a bypass capacitor is formed between the first or the second conductive layer 49 and the grounding layer 51 to have a great capacitance. The Bypass capacitor absorbs and suppresses the noise which may locally be superposed on the conductive layers 49.

This semiconductor device is effective when the conductive layers 49 have a wide area and as small a wiring resistance as several ohms. It should, however, be noted in FIG. 1 that the input and the reference signal connections 25 and 29 do not have such a wide area. Each of the parasitic input and reference resistances Ri and Rr is as large as several hundreds of ohms. The semiconductor device must consequently have a wide chip area if the grounding layer 51 is applied thereto.

Further turning to FIG. 8, another improved semiconductor device is what is revealed in the Japanese patent prepublication (A) No. 120,743 of 1991 referenced hereinabove. This semiconductor device is for reducing the noise which results from the coupling between various connections and the input or the reference signal connections 25 or 29 described in connection with FIG. 1 and comprises a single field effect transistor (FET) 55 of a depletion type and first and second field effect transistors 57 and 59 of an enhancement type.

Figure 8:
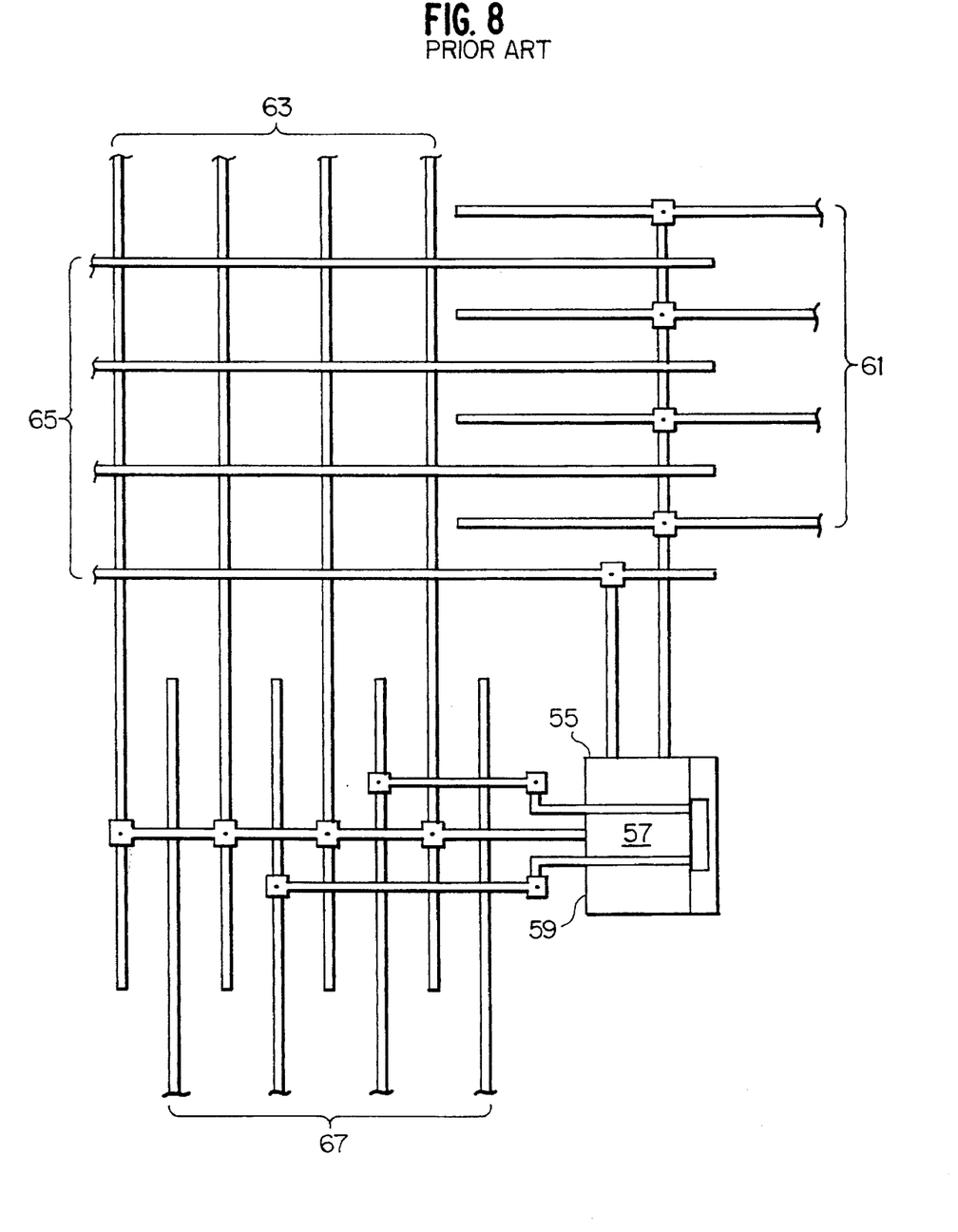
FIG. 8 is a layout diagram of another improved semiconductor device known in prior art.

In FIG. 8, a power connection to the single field effect transistor 55 is divided into a plurality of primary power wirings 61. Another power connection to the first and the second field effect transistors 57 and 59 is similarly divided into a plurality of secondary power wirings 63. The primary power wirings 61 are used as shields for primary signal wirings 65. The secondary power wirings 63 are likewise used as shields for secondary signal wirings 67.

It is understood that the shields are effective to suppress the noise which results from the coupling between the wirings 65 or 67. No attention is, however, directed to the noise which results from coupling between the semiconductor substrate and the signal wirings 65 or 67 by the parasitic input and reference capacitances Ci and Cr. In addition, the semiconductor device need a wide chip area due to division of the power connections into the primary and the secondary power wirings 61 and 63.

Figure 9:
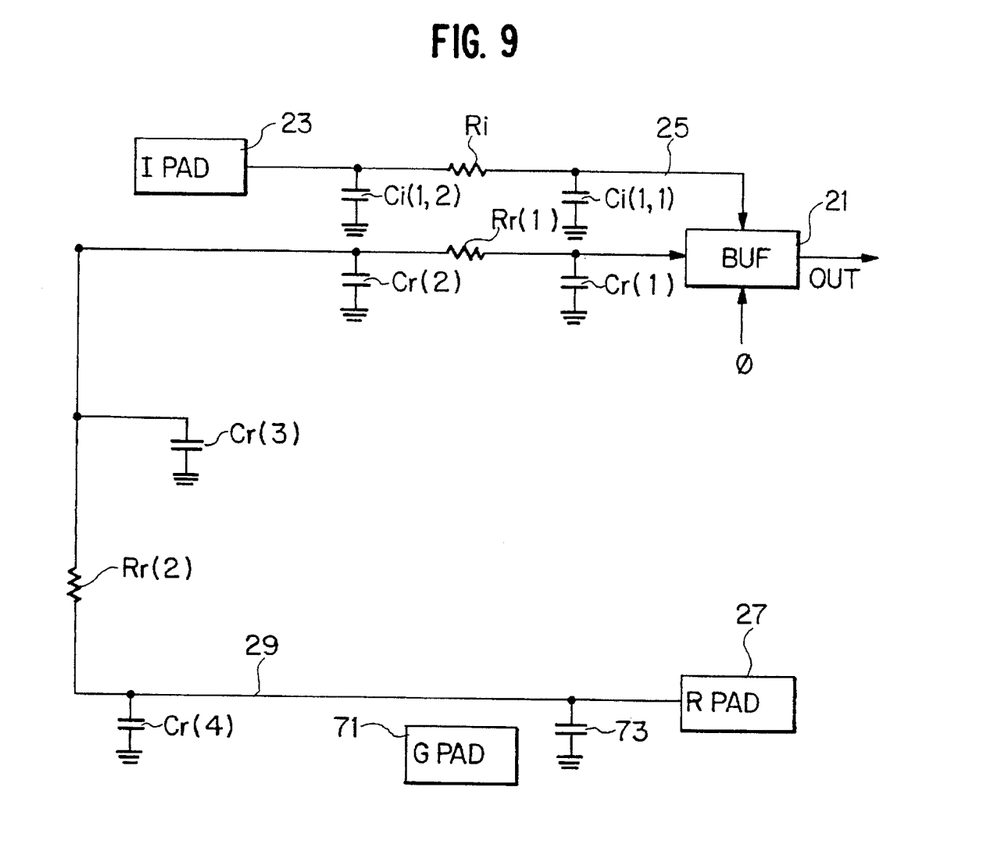
FIG. 9 is a layout diagram of a semiconductor device according to a first embodiment of the instant invention.

Referring now to FIG. 9, the description will proceed to a semiconductor device according to a first embodiment of this invention. Similar parts are designated by like reference numerals and symbols and are similarly operable with likewise named signals and levels.

Only one input buffer 21, one input signal pad 23, one input signal connection 25, and one reference signal connection 29 are used. The parasitic reference resistance of the reference signal connection 29 will afresh be referred to as a primary parasitic reference resistance Rr(1). Likewise, the first primary and secondary parasitic reference capacitances will be referred to as primary and secondary parasitic reference capacitances Cr(1) and Cr(2). In addition to the parasitic reference resistance and capacitances, the reference signal connection 29 has a secondary parasitic reference resistance Rr(2) and ternary and quaternary parasitic reference capacitances Cr(3) and Cr(4). This is because the reference signal connection 29 is lengthy in the example being illustrated and has its first part between the input buffer 21 and a node 69 parallel to the input signal connection 25 and a second part which is between the node 69 and the reference signal pad 27 and is laid on an area of the semiconductor substrate where the counter-electrode level little varies. At any rate, the reference signal reaches the input buffer 21 through the reference signal connection 29 with the buffer reference level REFb as in the foregoing.

In the manner which will shortly become clear, a grounding or ground pad (G PAD) 71 is formed adjacent to the reference signal pad 27 and to a portion near the reference signal pad 27, of the reference signal connection 29. The ground pad 71 is supplied with a ground level GND of the semiconductor device. As a compensation capacitor 73, a capacitor is formed near the ground pad 71 between the reference signal connection 29 and the semiconductor substrate depicted by ground as before. In the manner which will presently be described, it is alternatively possible to understand that the capacitor 73 is connected between the reference signal connection 29 adjacent to the reference signal pad 27 and the ground pad 71.

Figure 10:
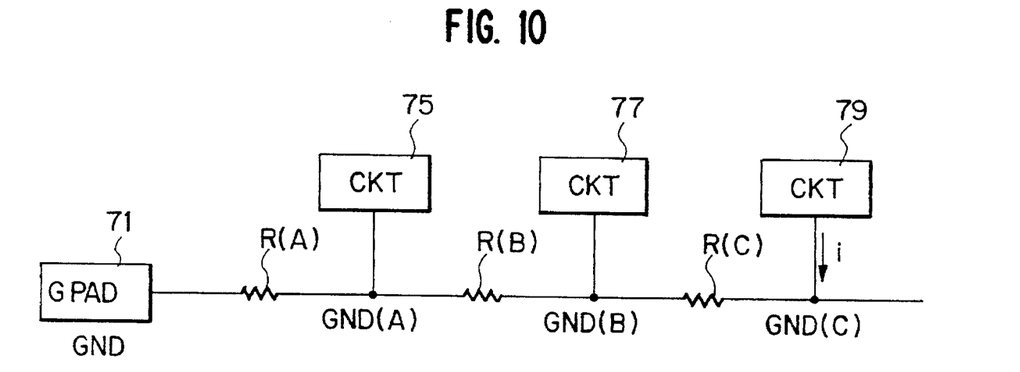
FIG. 10 is a partial layout diagram of the semiconductor device illustrated in FIG. 9.

Turning to FIG. 10 with FIG. 9 continuously referred to, the ground pad 71 reduces the counter-electrode level of the reference signal connection adjacent thereto. It will be presumed that first through third circuit elements (CKT) 75, 77 and 79 are formed on the semiconductor substrate nearer to and successively remoter from the ground pad 71 and have first through third resistances R(A), R(B), and R(C) as depicted and first through third counter-electrode levels Gnd(A), Gnd(B), and Gnd(C). The circuit elements 75 through 79 are supplied from the input buffer or buffers 21 with the output signal or signals.

It will furthermore be presumed that the third circuit element 79 is put in operation to cause an electric current i flow towards the ground pad 71 successively through the third to the first resistances R(C) through R(A). Under the circumstances, the third counter-electrode level Gnd(C) is the highest with the second and the first counter-electrode levels Gnd(B) and Gnd(A) rendered lower towards the ground level GND. The ground pad 71 therefore suppresses an influence of the noise which results from the counter-electrode levels relative to the semiconductor substrate adjacent to the ground pad 71.

Figure 11:
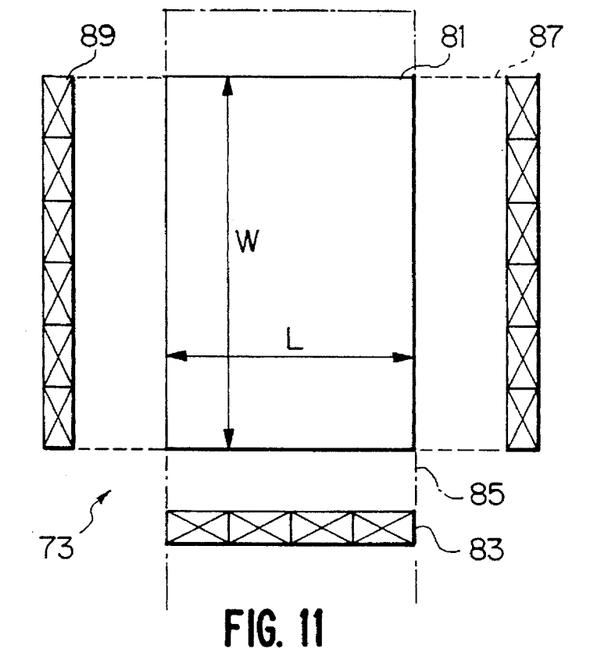
FIG. 11 is a layout diagram of a capacitor used in the semiconductor device shown in FIG. 9.
Figure 12:
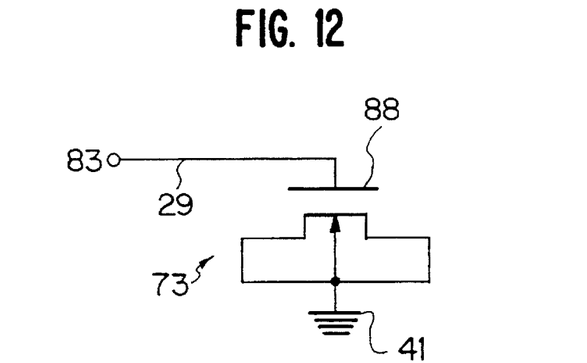
FIG. 12 shows an equivalent circuit of the capacitor depicted in FIG. 11.
Figure 13:
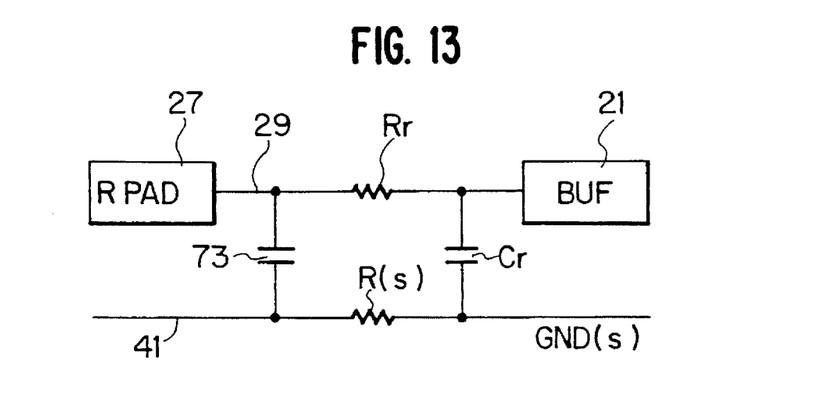
FIG. 13 is a schematic partial representation of the semiconductor device shown in FIG. 9.

Further turning to FIGS. 11 through 13 with FIG. 9 again referred to, the compensation capacitor 73 is provided by a Mats capacitance of a metal-oxide semiconductor transistor. More specifically, the compensation capacitor 73 comprises an impurity doped polycrystalline silicon layer 81 formed on the semiconductor substrate 41 with an insulator layer interposed. Through a first contact 83, the polycrystalline silicon layer 81 is connected to a first aluminium layer 85 which is of the type described in connection with FIG. 4 and is depicted by a dash-dot line. An impurity doped or diffusion layer 87 of the metal-oxide semiconductor transistor is formed in the semiconductor substrate 41 and is connected through a second contact 89 to a second aluminium layer (not shown). The second contact 89 may be formed on each side of the impurity doped region 87 as depicted in FIG. 11.

As illustrated in FIG. 12, the first aluminium layer 83 is connected to the reference signal connection 29. The second aluminium layer is preferably connected to the ground pad 71 described with reference to FIG. 9. The metal-oxide semiconductor transistor has a great gate capacitance as compared with its area. The gate capacitance depends on a gate length L (same reference symbol being used) and a gate width W illustrated in FIG. 11.

In FIG. 13, the reference signal connection 29 is depicted between the reference signal pad 27 and the input buffer 21 together with the primary and the secondary parasitic reference resistances Rr and the primary through the quaternary parasitic reference capacitances Cr. The reference signal connection 29 is laid on an area of the semiconductor substrate 41 which is shown as a connection and has a substrate resistance R(s) and a portion having a ground level Gnd(s) beneath the primary parasitic reference capacitance Cr(1) depicted in FIG. 9.

The compensation capacitor 73 is connected between the semiconductor substrate 41 and the reference signal connection 29 adjacent to the reference signal pad 27. It is assumed that the primary through the quaternary parasitic reference resistances have a total capacitance of several picofarads. In this event, the compensation capacitor 73 of about 1,000 pF can absorb and minimize the noise which results from the coupling capacitance provided by the primary through the quaternary parasitic reference capacitances.

Reviewing FIGS. 9 through 13 and additionally FIGS. 2 through 4, the compensation capacitor 73 can compensate for the noise which slowly varies. The compensation capacitor 73 alone is, however, insufficient to absorb the noise which rapidly varies. This is due to presence of the secondary parasitic reference resistance Rr(2). More particularly, it will be assumed that the secondary parasitic reference resistance has a resistance value of 400 ohms and that the compensation capacitor 73 has a capacitance of 50 pF. In such an event, the compensation capacitor 73 has a time constant of 20 ns when seen from the node 69. The compensation capacitor 73 can therefore absorb the noise which varies sufficiently slower than a period of 20 ns. The compensation capacitor 73, however, hardly absorbs the noise which rapidly varies with a period of several nanoseconds. The first part of the reference signal connection 29 is consequently laid geometrically parallel to the input signal connection 25. This equally suporposes on the input signal connection 25 and the first part of the reference signal connection 29 the noise resulting from the coupling capacitance and makes it possible to cancel the noise in the input buffer 21 in which the current mirror circuit CM is differentially operable in the manner illustrated with reference to FIG. 2. As an eventual consequence, it is possible to insure the little delay in operation of the input buffer 21.

Figure 14:
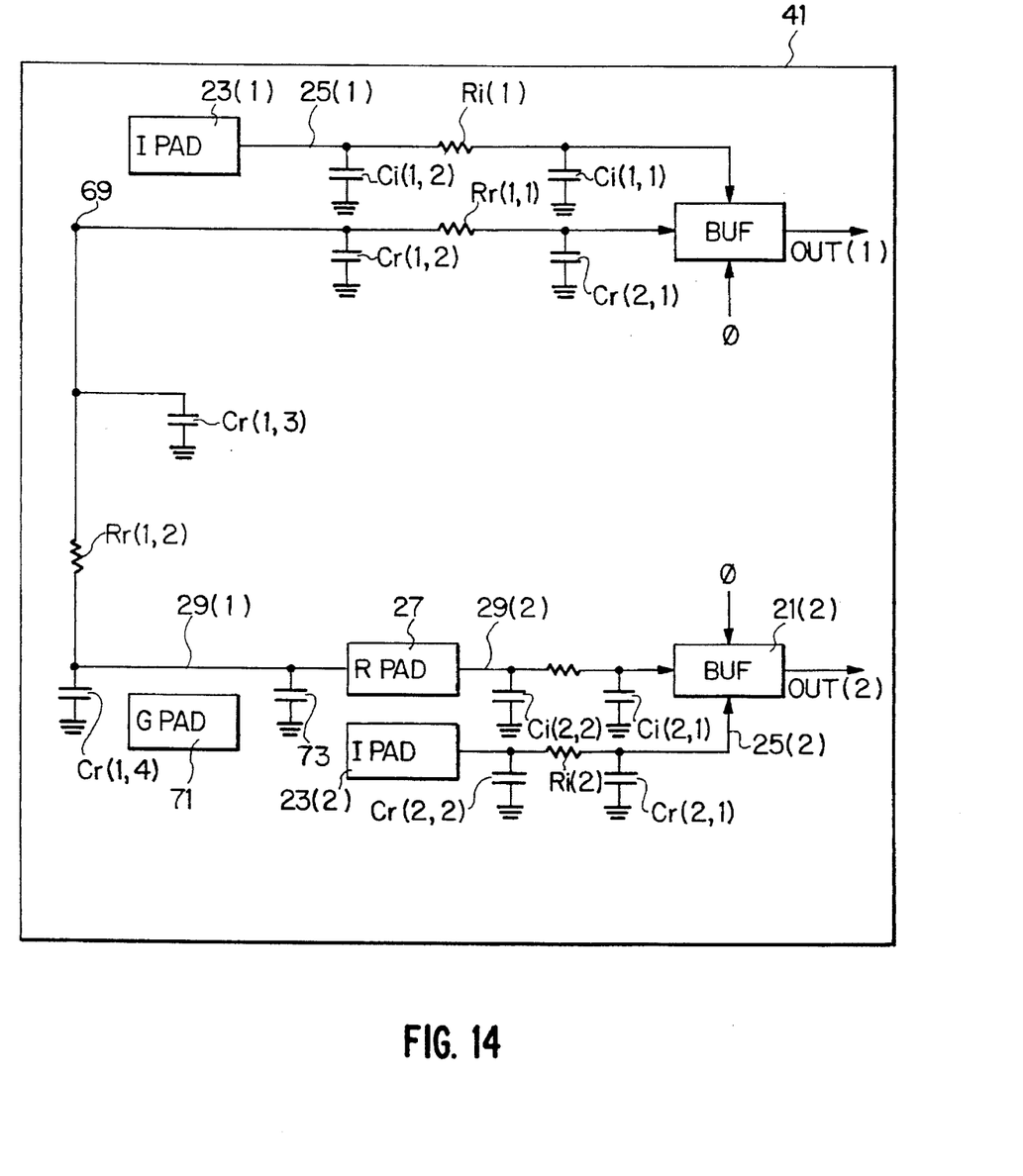
FIG. 14 is a layout diagram of a semiconductor device according to a second embodiment of this invention.

Referring to FIG. 14, attention will be directed to a semiconductor device according to a second embodiment of this invention. Similar parts are again designated by like reference numerals and symbols and are similarly operable with likewise named signals and levels.

Like in FIG. 1, use is made of first and second input buffers 21, first and second input signal connections 25, and first and second reference signal connections 29. As in FIG. 9, the first part of the first reference signal connection 29(1) is laid parallel to the first input signal connection 25(1) between the first input buffer 21(1) and the mode 69 and has a first primary parasitic reference resistance Rr(1, 1) and first primary and secondary parasitic reference capacitances Cr(1, 1) and Cr(1, 2). The second part of the first reference signal connection 29(1) has a first secondary parasitic reference resistance Rr(1, 2) and first ternary and quaternary parasitic reference capacitances Cr(1, 3) and Cr(1, 4). The semiconductor substrate is indicated at 41.

In the example being illustrated, the second reference signal connection 29(2) has a short length and is laid wholly parallel to the second input signal connection 25(2). If the semiconductor device comprises an additional input buffer, an additional signal input pad, an additional input signal connection, and an additional reference signal connection, the additional reference signal connection is laid at least partly parallel to the additional input signal connection.

It will now be presumed that the second reference signal connection 29(2) is long like the first reference signal connection 29(1) being exemplified. In this event, the second reference signal connection 29(2) should comprise second primary and secondary parts. The second primary part is laid parallel to the second input signal connection 25(2) between the second input buffer 21(2) and a second node which the second primary part has adjacent to the second input signal pad 23(2). The second secondary part extends between the second node and the reference signal pad 27. The ground pad 71 is used in colon to the first and the second reference signal connections 29. A second capacitor is connected to the second secondary part adjacent to the reference signal pad 27 and connected to the semiconductor substrate 41 or to the ground pad 71. It is possible to understand that the second node and the second capacitor are illustrated at 69 and 73. Preferably, the second secondary part is laid on an area of the semiconductor substrate 41 where the noise is as little as possible introduced through the coupling capacitance from other connections, such as those for delivering the first and/or the second output signal OUT to the circuit elements, as 75 through 79 and as others of the semiconductor device.

Figure 15A:
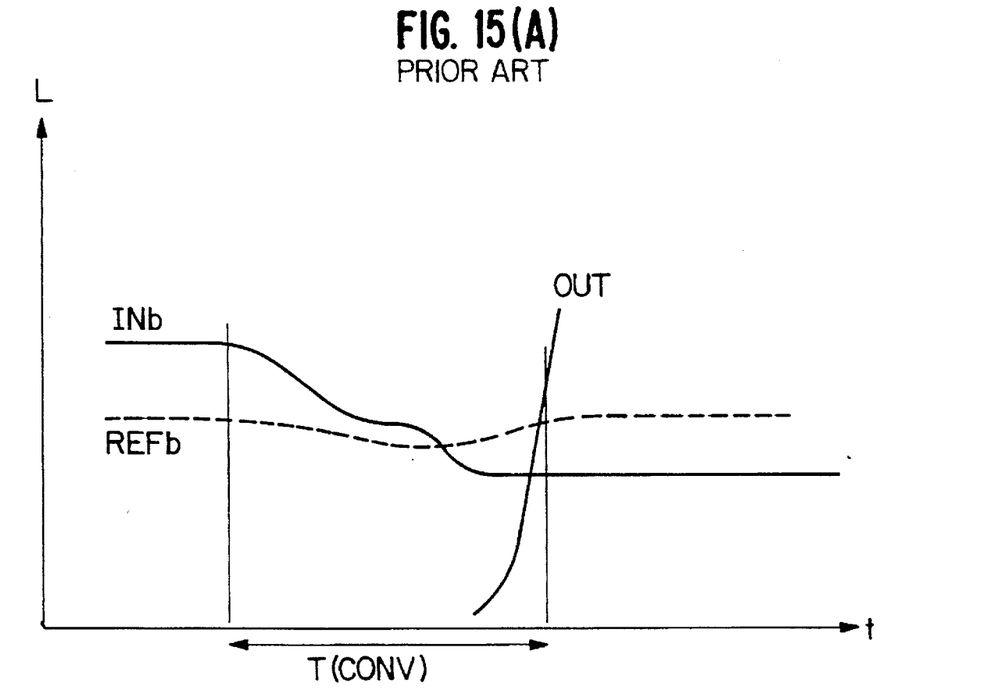
FIGS. 15(A) and 15(B) schematically show operation of the semiconductor devices depicted in FIG. 9 or 14 in contrast to operation of the conventional semiconductor device shown in FIG. 1.
Figure 15B:
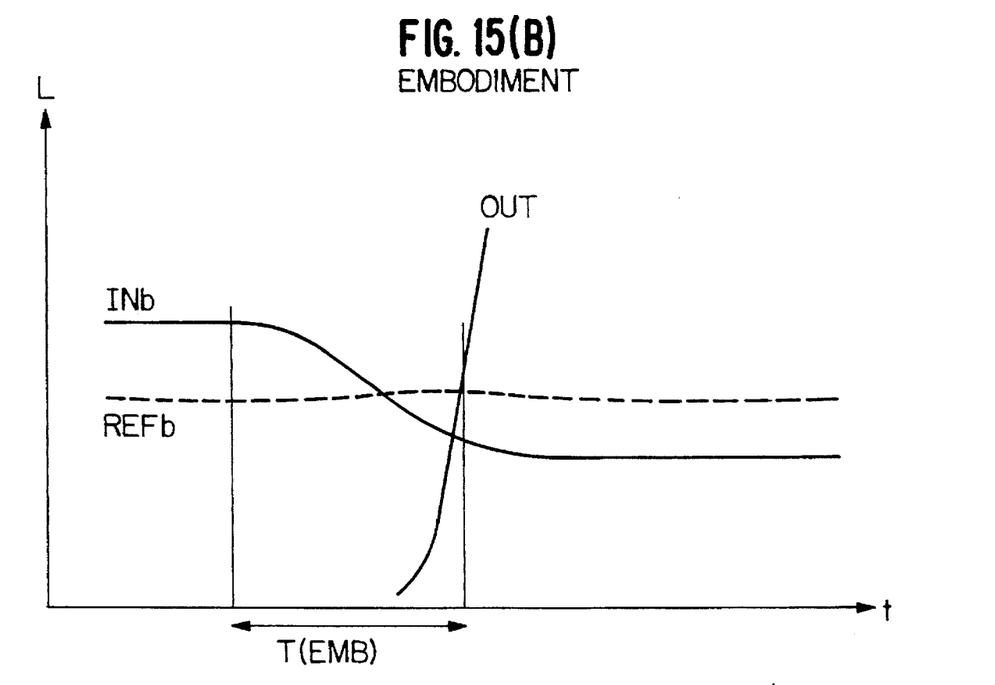

Turning to FIG. 15 with FIGS. 1, 9, and 14 additionally referred to, the input buffer 21 is supplied with the input and the reference signals with the buffer input level INb and the buffer reference level REFb. The output signal OUT is also depicted. Like in FIG. 5, time t proceeds rightwards along the abscissa. Various levels L of the signals are shown along the ordinate.

In FIG. 15 (A), the output signal is exemplified for FIG. 1 and reaches the complementary metal-oxide semiconductor logic level a time interval T(conv) later than turn of the buffer input level from the high level to the low level.

In contrast, the output signal is exemplified in FIG. 15(B) for FIG. 9 or 14 and reaches the complementary metal-oxide semiconductor logic level a shorter time interval T(emb) later than the turn. It is appreciated that this invention reduces the delay even when the noise is introduced from the coupling capacitance.

While this invention has thus far been described in specific conjunction with only two preferred embodiments thereof, it will now be readily possible for one skilled in the art to put this invention into effect in various other manners. For example, it is possible to use two or more reference signal pads, such as 27, each accompanied by a ground pad 71, and three or more input pads, such as 23. It is unnecessary that the input signal connection 25 and the first part of the reference signal connection 29 be straight.

What is claimed is:

1. A semiconductor device on a semiconductor substrate comprising:

an input buffer for generating an output signal by comparing an input signal with a reference signal;

an input signal pad for receiving said input signal;

a first connection line running from said input signal pad to said input buffer to convey said input signal from said input signal pad to said input buffer; and a second connection line for receiving said reference signal and connected to said input buffer to convey said reference signal to said input buffer, said second connection line having a first portion which runs along and in parallel to said first connection line.

2. The semiconductor device as claimed in claim 1, further comprising a reference signal pad for receiving said reference signal, said second connection line further having a second portion intervening between said reference signal pad and said first portion.

3. The semiconductor device as claimed in claim 2, further comprising a ground pad for receiving a ground voltage and provided adjacently to said second portion of said second connection line, said ground pad being connected with said semiconductor substrate.

4. The semiconductor device as claimed in claim 3, further comprising a capacitor connected between said second portion of said second connection line and said semiconductor substrate.

5. A semiconductor device on a semiconductor substrate comprising:

a first input buffer generating a first output signal by comparing a first input signal with a reference signal;

a first input signal pad for receiving said first input signal;

a first connection line running from said first input signal pad to said first input buffer to convey said first input signal from said first input signal pad to said first input buffer;

a reference signal pad for receiving said reference signal;

a second connection line connected between said reference pad and said first input buffer to convey said reference signal to said first input buffer, said second connection line having a first portion which runs along and in parallel to said first connection line, a second input buffer generating a second output signal by comparing a second input signal with said reference signal;

a second input signal pad for receiving said second input signal;

a third connection line running from said second input signal pad to said second input buffer to convey said second input signal from said second input signal pad to said second input buffer; and a fourth connection line connected between said reference pad and said second input buffer to convey said reference signal to said second input buffer, said forth connection line running along and in parallel to said third connection line.

6. The semiconductor device as claimed in claim 5, wherein said second connection line further has a second portion intervening between said reference signal pad and said first portion.

7. The semiconductor device as claimed in claim 6, further comprising a ground pad for receiving a ground voltage and provided adjacently to said second portion of said second connection line, said ground pad being connected with said semiconductor substrate.

8. The semiconductor device as claimed in claim 7, further comprising a capacitor connected between said second portion of said second connection line and said semiconductor substrate, said capacitor being provided adjacently to said ground pad.

\* \* \* \* \*

UNITED STATES PATENT AND TRADEMARK OFFICE
CERTIFICATE OF CORRECTION

PATENT NO. : 5,557,235
DATED : September 17, 1996
INVENTOR(S) : Hiroki KOIKE

It is certified that error appears in the above-indentified patent and that said Letters Patent is hereby corrected as shown below:

Column 1, line 63, delete "chap" and insert --chip--.

Column 4, line 6, delete "REPb" and insert --REFb--.

Column 7, line 44, delete "Mats" and insert --gate--.

Column 9, line 14, delete "colon" and insert --common--.

Signed and Sealed this

Twenty-sixth Day of November 1996

Attest:

BRUCE LEHMAN

Attesting Officer     Commissioner of Patents and Trademarks